(12) United States Patent
Qiao et al.

(10) Patent No.: US 11,211,947 B2
(45) Date of Patent: Dec. 28, 2021

(54) POLAR CODE ENCODING METHOD AND APPARATUS, POLAR CODE DECODING METHOD AND APPARATUS, AND DEVICE

(71) Applicant: HUAWEI TECHNOLOGIES CO., LTD., Guangdong (CN)

(72) Inventors: Yunfei Qiao, Hangzhou (CN); Gongzheng Zhang, Hangzhou (CN); Chaolong Zhang, Hangzhou (CN); Jian Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 12 days.

(21) Appl. No.: 16/735,244

(22) Filed: Jan. 6, 2020

(65) Prior Publication Data

US 2020/0145023 A1 May 7, 2020

Related U.S. Application Data

(63) Continuation of application No. PCT/CN2018/089439, filed on Jun. 1, 2018.

(30) Foreign Application Priority Data

Aug. 4, 2017 (CN) .......................... 201710661694.7

(51) Int. Cl.
*H03M 13/09* (2006.01)
*H04W 76/11* (2018.01)
(Continued)

(52) U.S. Cl.
CPC ......... *H03M 13/098* (2013.01); *H03M 13/13* (2013.01); *H03M 13/31* (2013.01); *H04W 76/11* (2018.02)

(58) Field of Classification Search
CPC .... H03M 13/098; H03M 13/13; H03M 13/31; H03M 13/09; H04W 76/11; H04L 1/00; H04L 1/0071; H04L 1/0057; H04L 1/0061

See application file for complete search history.

(56) References Cited

U.S. PATENT DOCUMENTS 10,320,422 B2 *   6/2019   Shen ................... H04L 1/0061
2015/0263767 A1 * 9/2015   Shin .................... H03M 13/13
                                                  714/796

(Continued)

FOREIGN PATENT DOCUMENTS

CN     102694625 A    9/2012
CN     103281166 A    9/2013

(Continued)

OTHER PUBLICATIONS

3GPP TS 38.212 V0.0.0 (May 2017), "3rd Generation Partnership Project; Technical Specification Group Radio Access Network; NR; Multiplexing and channel coding (Release 15)," May 2017, 10 pages.

(Continued)

*Primary Examiner* — Thien Nguyen

(74) *Attorney, Agent, or Firm* — Fish & Richardson P.C.

(57) ABSTRACT

This application provides a polar code encoding and decoding method and apparatus and a device. An example method includes: sequentially configuring, by a sending device, information bits and first check bits on subchannels in a first subchannel set, and configuring frozen bits on subchannels in a second subchannel set, where the subchannels in the first subchannel set are sorted according to a natural order of serial numbers of the subchannels; and performing polarization encoding on bits on the subchannels to obtain an (Continued)

encoded sequence. In this way, encoding efficiency and decoding efficiency are improved.

17 Claims, 9 Drawing Sheets

(51) Int. Cl.
    *H03M 13/13*     (2006.01)
    *H03M 13/31*     (2006.01)

(56) References Cited

U.S. PATENT DOCUMENTS

| | | | |
|---|---|---|---|
| 2016/0013887 A1* | 1/2016 | Shen | H04L 1/0045 375/295 |
| 2016/0056843 A1* | 2/2016 | Gross | H03M 13/6561 714/781 |
| 2016/0079999 A1 | 3/2016 | Shen et al. | |
| 2017/0366199 A1* | 12/2017 | Ge | G06F 11/1004 |
| 2018/0026663 A1* | 1/2018 | Wu | H03M 13/6362 714/776 |
| 2020/0007160 A1* | 1/2020 | Li | H03M 13/6561 |
| 2020/0052719 A1* | 2/2020 | Chaki | H03M 13/098 |
| 2020/0195276 A1* | 6/2020 | Wu | H04W 72/0446 |
| 2021/0152290 A1* | 5/2021 | Li | H04L 1/0057 |

FOREIGN PATENT DOCUMENTS

| | | |
|---|---|---|
| CN | 105811998 A | 7/2016 |
| CN | 106788456 A | 5/2017 |
| CN | 106877885 A | 6/2017 |
| CN | 106899311 A | 6/2017 |
| WO | 2017092693 A1 | 6/2017 |
| WO | 2017101023 A1 | 6/2017 |

OTHER PUBLICATIONS

Coherent Logix Inc., "Early Block Discrimination on DCI Blind Detection," 3GPP TSG RAN1-NR#2, R1-1711573, Qingdao, CN, Jun. 27-30, 2017, 7 pages.

Extended European Search Report issued in European Application No. 18840500.5 dated Jun. 4, 2020, 10 pages.

Huawei et al., "Polar code design," 3GPP TSG RAN WG1 Meeting #89, R1-1706965, Hangzhou, China, May 15-19, 2017, 12 pages.

Huawei et al., "Summary of polar code design for control channels," 3GPP TSG RAN WG1 Ad-Hoc Meeting, R1-1700088, Spokane, USA, Jan. 16-20, 2017, 10 pages.

Intel Corporation, "Polar code design," 3GPP TSG RAN WG1 Ad hoc, R1-1700386, Spokane, USA, Jan. 16-20, 2017, 12 pages.

Office Action issued in Chinese Application No. 201910711383.6 dated Mar. 25, 2020, 19 pages (with English translation).

PCT International Search Report and Written Opinion issued in International Application No. PCT/CN2018/089439 dated Sep. 5, 2018, 16 pages (with English translation).

Samsung, "Polar Code Construction," 3GPP TSG RAN WG1 NR Ad-Hoc#2, R1-1710747, Qingdao, P.R. China, Jun. 27-30, 2017, 6 pages.

\* cited by examiner

POLAR CODE ENCODING METHOD AND APPARATUS, POLAR CODE DECODING METHOD AND APPARATUS, AND DEVICE

CROSS-REFERENCE TO RELATED APPLICATIONS

This application is a continuation of International Application No. PCT/CN2018/089439 filed on Jun. 1, 2018, which claims priority on Chinese Patent Application No. 201710661694.7, filed on Aug. 4, 2017. The disclosures of the aforementioned applications are hereby incorporated by reference in their entireties.

TECHNICAL FIELD

This application relates to the communications field, and in particular, to a polar code encoding method and apparatus, a polar code decoding method and apparatus, and a device.

BACKGROUND

A polar code is the first known channel coding method that strictly proves to "achieve" a channel capacity. In the case of different code lengths, particularly for a finite code, performance of the polar code is far better than that of a turbo code and an LDPC code. In addition, the polar code has a relatively low computational complexity in encoding and decoding. With these advantages, the polar code has a great development and application outlook in the $5^{th}$ Generation (5G) mobile communications technology and is accepted for control channel coding in an Enhanced Mobile Broadband (eMBB) service in the $3^{rd}$ Generation Partnership Project (3GPP) radio access network (RAN1) meeting #87.

Specifically, the polar code is a channel-dependent code. The polar code performs polar code polarization processing on N identical channels W, to obtain N subchannels. Certainly, Bhattacharyya parameters of the N subchannels either approach 0 or approach 1. In actual application of polar codes, an important operation is to calculate reliability of all the N subchannels for the different channels W, and then select K subchannels with relatively high reliability. A set of position index numbers corresponding to these subchannels is referred to as an information set $\mathcal{A}^c$. Other bits are set as fixed values predetermined on a transmit end and a receive end and are referred to as frozen bits, and a set of serial numbers of the frozen bits is denoted by a complementary set $\mathcal{A}^{c\,c}$ of $\mathcal{A}^c$. During polar code encoding, K information symbols are placed in positions corresponding to an information set, and fixed known symbols are placed in remaining (N–K) positions (referred to as a frozen set). Generally, the N–K fixed known symbols may be all 0 symbols, where K≤N. Actually, a value of a frozen bit may be set randomly, provided that the value of the frozen bit is predetermined on the transmit end and the receive end. Because there is a one-to-one correspondence between a polarization channel and a bit, the polarization channel is usually indicated by using a bit position.

With development of a polar code technology, an original encoding mode needs to be improved to adapt to various scenarios.

SUMMARY

This application provides a polar code encoding method and apparatus, a polar code decoding method and apparatus, and a device, to improve encoding efficiency and decoding efficiency to adapt to various scenarios.

According to a first aspect, this application provides a polar code encoding method, including:

sequentially configuring, by a sending device, information bits and first check bits on subchannels in a first subchannel set, and configuring frozen bits on subchannels in a second subchannel set, where the subchannels in the first subchannel set are sorted according to a natural order of serial numbers of the subchannels, reliability of the subchannels in the first subchannel set is higher than reliability of the subchannels in the second subchannel set, both the first subchannel set and the second subchannel set include serial numbers of subchannels, and the subchannel may be understood as a position corresponding to a bit; and performing, by the sending device, polarization encoding on bits on the subchannels to obtain an encoded sequence.

Because the subchannels in the first subchannel set are sorted according to the natural order of the serial numbers of the subchannels, when the information bits and the first check bits are sequentially placed on the subchannels in the first subchannel set, the information bits and the first check bits are sequentially placed on the subchannels in order, without a need to skip one or more subchannels to find another subchannel. In this way, encoding efficiency is improved.

In a possible design, the sorting according to a natural order is: sorting the subchannels in ascending order of the serial numbers of the subchannels.

In a possible design, at least one first check bit is alternately arranged between the information bits. Specifically, an interleaver may be used to interleave the information bits and the first check bits, so that at least one first check bit is alternately arranged between the information bits. The alternately arranged information bits and first check bits may be sequentially configured on the subchannels in the first subchannel set.

In a possible design, the first check bits are cyclic redundancy check CRC bits.

In a possible design, the first check bits include a first CRC bit and a second CRC bit, the first CRC bit is determined based on the information bits, and the second CRC bit is determined based on a quantity of decoding paths.

In a possible design, before the sequentially configuring, by a sending device, information bits and first check bits on subchannels in a first subchannel set, and configuring frozen bits on subchannels in a second subchannel set, the method further includes:

determining, by the sending device, a subchannel corresponding to a second check bit, and configuring the second check bit on the subchannel corresponding to the second check bit; and determining, by the sending device, the first subchannel set and the second subchannel set from subchannels other than the subchannel corresponding to the second check bit.

In a possible design, the second check bit is a parity check PC bit.

In a possible design, the subchannels in the second subchannel set are sorted according to a natural order of serial numbers of the subchannels.

In a possible design, at least some of the frozen bits carry a terminal identifier.

Subchannels in the second subchannel set other than subchannels corresponding to the terminal identifier are sorted according to a natural order of serial numbers of the subchannels.

The sending device adds the terminal identifier to information sent to a receiving device. When the receiving device performs decoding, the decoding succeeds only when a correct terminal identifier is placed in the frozen bits. Otherwise, the decoding performed by the receiving device fails. Placement positions of the terminal identifier may be predetermined by the sending device and the receiving device.

According to a second aspect, this application provides a polar code decoding method, including:

obtaining, by a receiving device, a to-be-decoded sequence; and performing, by the receiving device, polarization decoding on the to-be-decoded sequence based on subchannels on which information bits, first check bits, and frozen bits are configured, where the information bits and the first check bits are sequentially configured on subchannels in a first subchannel set, the frozen bits are sequentially configured on subchannels in a second subchannel set, the subchannels in the first subchannel set are sorted according to a natural order, and reliability of the subchannels in the first subchannel set is higher than reliability of the subchannels in the second subchannel set.

In a possible design, the sorting according to a natural order is: sorting the subchannels in ascending order of serial numbers of the subchannels.

In a possible design, at least one first check bit is alternately arranged between the information bits.

In a possible design, the first check bits are cyclic redundancy check CRC bits.

In a possible design, the first check bits include a first CRC bit and a second CRC bit, the first CRC bit is determined based on the information bits, and the second CRC bit is determined based on a quantity of decoding paths.

In a possible design, the performing, by the receiving device, polarization decoding on the to-be-decoded sequence based on subchannels on which information bits, first check bits, and frozen bits are configured includes:

performing, by the receiving device, polarization decoding on the to-be-decoded sequence based on subchannels on which the information bits, the first check bits, a second check bit, and the frozen bits are configured, where the first subchannel set and the second subchannel set are sets determined in subchannels other than a subchannel corresponding to the second check bit.

In a possible design, the second check bit is a parity check PC bit.

In a possible design, the subchannels in the second subchannel set are sorted according to a natural order of serial numbers of the subchannels.

In a possible design, at least some of the frozen bits carry a terminal identifier.

Subchannels in the second subchannel set other than subchannels corresponding to the terminal identifier are sorted according to a natural order of serial numbers of the subchannels.

According to a third aspect, this application provides a polar code encoding apparatus, including:

a configuration module, configured to sequentially configure information bits and first check bits on subchannels in a first subchannel set, and configure frozen bits on subchannels in a second subchannel set, where the subchannels in the first subchannel set are sorted according to a natural order of serial numbers of the subchannels, and reliability of the subchannels in the first subchannel set is higher than reliability of the subchannels in the second subchannel set; and an encoding module, configured to perform polarization encoding on bits on the subchannels to obtain an encoded sequence.

In a possible design, the sorting according to a natural order is: sorting the subchannels in ascending order of the serial numbers of the subchannels.

In a possible design, at least one first check bit is alternately arranged between the information bits.

In a possible design, the first check bits are cyclic redundancy check CRC bits.

In a possible design, the first check bits include a first CRC bit and a second CRC bit, the first CRC bit is determined based on the information bits, and the second CRC bit is determined based on a quantity of decoding paths.

In a possible design, the configuration module is further configured to:

determine a subchannel corresponding to a second check bit, and configure the second check bit on the subchannel corresponding to the second check bit; and determine the first subchannel set and the second subchannel set from subchannels other than the subchannel corresponding to the second check bit.

In a possible design, the second check bit is a parity check PC bit.

In a possible design, the subchannels in the second subchannel set are sorted according to a natural order of serial numbers of the subchannels.

In a possible design, at least some of the frozen bits carry a terminal identifier.

Subchannels in the second subchannel set other than subchannels corresponding to the terminal identifier are sorted according to a natural order of serial numbers of the subchannels.

According to a fourth aspect, this application provides a polar code decoding apparatus, including:

an obtaining module, configured to obtain a to-be-decoded sequence; and a decoding module, configured to perform polarization decoding on the to-be-decoded sequence based on subchannels on which information bits, first check bits, and frozen bits are configured, where the information bits and the first check bits are sequentially configured on subchannels in a first subchannel set, the frozen bits are sequentially configured on subchannels in a second subchannel set, the subchannels in the first subchannel set are sorted according to a natural order, and reliability of the subchannels in the first subchannel set is higher than reliability of the subchannels in the second subchannel set.

In a possible design, the sorting according to a natural order is: sorting the subchannels in ascending order of serial numbers of the subchannels.

In a possible design, at least one first check bit is alternately arranged between the information bits.

In a possible design, the first check bits are cyclic redundancy check CRC bits.

In a possible design, the first check bits include a first CRC bit and a second CRC bit, the first CRC bit is determined based on the information bits, and the second CRC bit is determined based on a quantity of decoding paths.

In a possible design, the decoding module is specifically configured to:

perform polarization decoding on the to-be-decoded sequence based on subchannels on which the information bits, the first check bits, a second check bit, and the frozen bits are configured, where the first subchannel set and the second subchannel set are sets determined in subchannels other than a subchannel corresponding to the second check bit.

In a possible design, the second check bit is a parity check PC bit.

In a possible design, the subchannels in the second subchannel set are sorted according to a natural order of serial numbers of the subchannels.

In a possible design, at least some of the frozen bits carry a terminal identifier.

Subchannels in the second subchannel set other than subchannels corresponding to the terminal identifier are sorted according to a natural order of serial numbers of the subchannels.

According to a fifth aspect, this application provides a sending device, including: a memory, a processor, and a computer program, where the computer program is stored in the memory, and the processor runs the computer program to execute the encoding method according to the first aspect and the possible designs in the first aspect.

In a possible design, the sending device further includes a transmitter, configured to send an encoded sequence that is obtained after the processor performs polar encoding.

According to a sixth aspect, this application provides a receiving device, including: a memory, a processor, and a computer program, where the computer program is stored in the memory, and the processor runs the computer program to execute the decoding method according to the second aspect and the possible designs in the second aspect.

In this application, the encoding apparatus may be integrated into the processor of the sending device, and the decoding apparatus may be integrated into the processor of the receiving device. The sending device may be a terminal device or a network device, and the receiving device may be a terminal device or a network device. When the sending device is a terminal device, the receiving device is a network device. When the sending device is a network device, the receiving device is a terminal device.

According to a seventh aspect, this application provides a storage medium, including: a readable storage medium and a computer program, where the computer program is used to implement the encoding method according to the first aspect and the possible designs in the first aspect.

According to an eighth aspect, this application provides a storage medium, including: a readable storage medium and a computer program, where the computer program is used to implement the decoding method according to the second aspect and the possible designs in the second aspect.

According to the encoding method and the decoding method provided in embodiments, the sending device sequentially configures the information bits and the first check bits on the subchannels in the first subchannel set, configures the frozen bits on the subchannels in the second subchannel set, and performs polarization encoding on the bits on the subchannels to obtain the encoded sequence. The subchannels in the first subchannel set are sorted according to the natural order of the serial numbers of the subchannels, and the reliability of the subchannels in the first subchannel set is higher than the reliability of the subchannels in the second subchannel set. When encoding reliability is met, the information bits and the first check bits can be directly and sequentially placed on subchannels that are sorted according to a natural order, without a need to perform a skipping operation. In this way, encoding efficiency and decoding efficiency are improved to adapt to requirements for communication rates in various communication scenarios.

DESCRIPTION OF EMBODIMENTS

Embodiments of this application may be applied to a wireless communications system. It should be noted that the wireless communications system mentioned in the embodiments of this application includes but is not limited to: a Narrowband Internet of Things (NB-IoT) system, a Global System for Mobile Communications (GSM), an Enhanced Data rate for GSM Evolution (EDGE) system, a Wideband Code Division Multiple Access (WCDMA) system, a Code Division Multiple Access 2000 (CDMA2000) system, a Time Division-Synchronous Code Division Multiple Access (TD-SCDMA) system, a Long Term Evolution (LTE) system, and three major application scenarios of the next-generation 5G mobile communications system, namely, Enhanced Mobile Broadband (eMBB), URLLC, and Massive Machine-Type Communications (mMTC).

A communication apparatus related to this application is mainly a network device or a terminal device. If a sending device in this application is a network device, a receiving device is a terminal device. If a sending device in this application is a terminal device, a receiving device is a network device.

In the embodiments of this application, the terminal device includes but is not limited to a mobile station (MS), a mobile terminal, a mobile telephone, a handset, portable equipment, and the like. The terminal device may communicate with one or more core networks by using a radio access network (RAN). For example, the terminal device may be a mobile telephone (or referred to as a "cellular" telephone), or a computer having a wireless communication function; the terminal device may further be a portable, pocket-sized, handheld, computer built-in, or in-vehicle mobile apparatus or device.

This application describes the embodiments with reference to a network device. The network device may be a device configured to communicate with a terminal device.

For example, the network device may be a base transceiver station (BTS) in a GSM system or a CDMA system, may be a NodeB (NB) in a WCDMA system, or may be an evolved NodeB (eNB or eNodeB) in an LTE system. Alternatively, the network device may be a relay station, an access point, an in-vehicle device, a wearable device, a network-side device in a future 5G network, a network device in a future evolved Public Land Mobile Network (PLMN), or the like.

Figure 1:
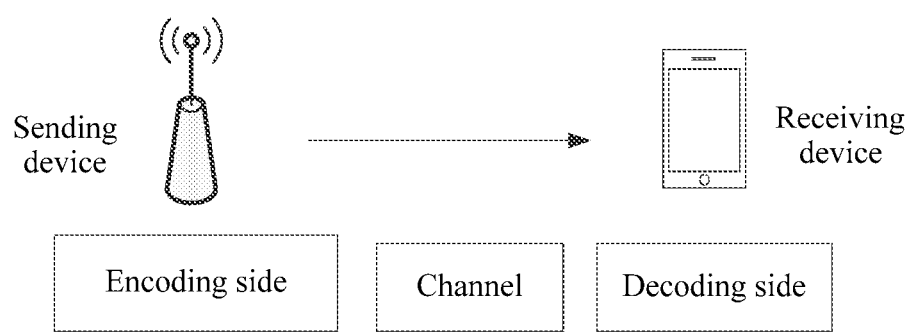
FIG. 1 is a schematic architectural diagram of a system including a sending device and a receiving device according to this application.

A communications system in this application may include a sending device and a receiving device. FIG. 1 is a schematic architectural diagram of a system including a sending device and a receiving device according to this application. As shown in FIG. 1, the sending device is an encoder and may be configured to perform polar encoding and output an encoded sequence, and the encoded sequence is transmitted to a decoding side through a channel. The receiving device is a decoder and may be configured to receive a to-be-decoded sequence (namely, the encoded sequence) sent by the sending device, and decode the to-be-decoded sequence.

A polar code is a linear block code. An encoding matrix of the polar code is $G_N$, and an encoded process is $u^N G_N = x^N$, where $u^N = (u_1, u_2, \ldots, u_N)$ is a binary row vector with length N (length of a mother code), $G_N$ is an N×N matrix, $G_N = F_2^{\otimes(\log_2(N))}$, matrix $$F_2 = \begin{bmatrix} 1 & 0 \\ 1 & 1 \end{bmatrix},$$

$F_2^{\otimes(\log_2(N))}$ is a Kronecker power of F2 and is defined as $F^{\otimes(\log_2(N))} = F \otimes F^{\otimes((\log_2(N))-1)}$.

Specifically, the polar code is a channel-dependent code. Generally, in a construction process of the polar code, an encoding matrix of a polar code with a mother code length N includes N rows that are corresponding to N polarization channels W, respectively. Certainly, Bhattacharyya parameters of the N polarization channels either approach 0 or approach 1. In a polar code encoding process, some bits in $u^N$ are used to carry information and are referred to as information bits, and a set of indexes of these bits is denoted by $\mathcal{A}^c$; other bits are set as fixed values predetermined by a transmit end and a receive end and are referred to as fixed bits, and a set of indexes of these bits is denoted by a complementary set $\mathcal{A}^{c\,c}$ of $\mathcal{A}$.

Figure 2:
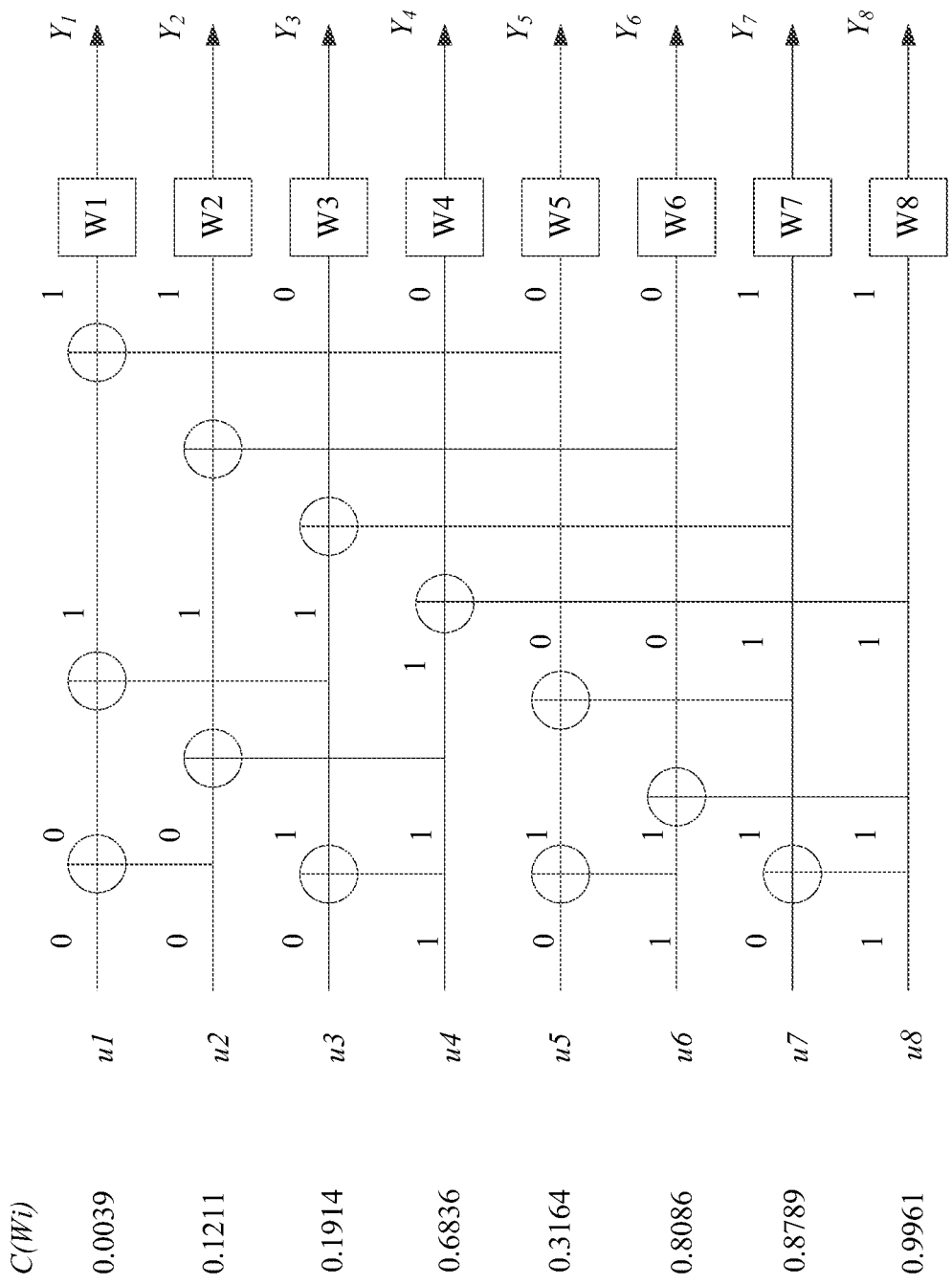
FIG. 2 is a polarization model of eight channels according to an embodiment of this application.

FIG. 2 is a polarization model of eight channels according to an embodiment of this application. As shown in FIG. 2, N=8. Information $u^8 = (u_1, u_2, \ldots, u_8)$ is input to an encoder, and after the information is encoded by eight polarization channels W (W1, W2, . . . , and W8), an encoded sequence $Y^N$ is finally output: $Y = (Y_1, Y_2, \ldots, Y_8)$. During channel decoding, a receive end may perform SC decoding, SCL decoding, or the like.

In this embodiment, to enable a decoder to check a decoding result, check bits are introduced to the encoder. In this embodiment, for a manner of introducing the check bits to the encoder, a manner of placing information bits and the check bits in a polar encoding process is described in detail.

Figure 3:
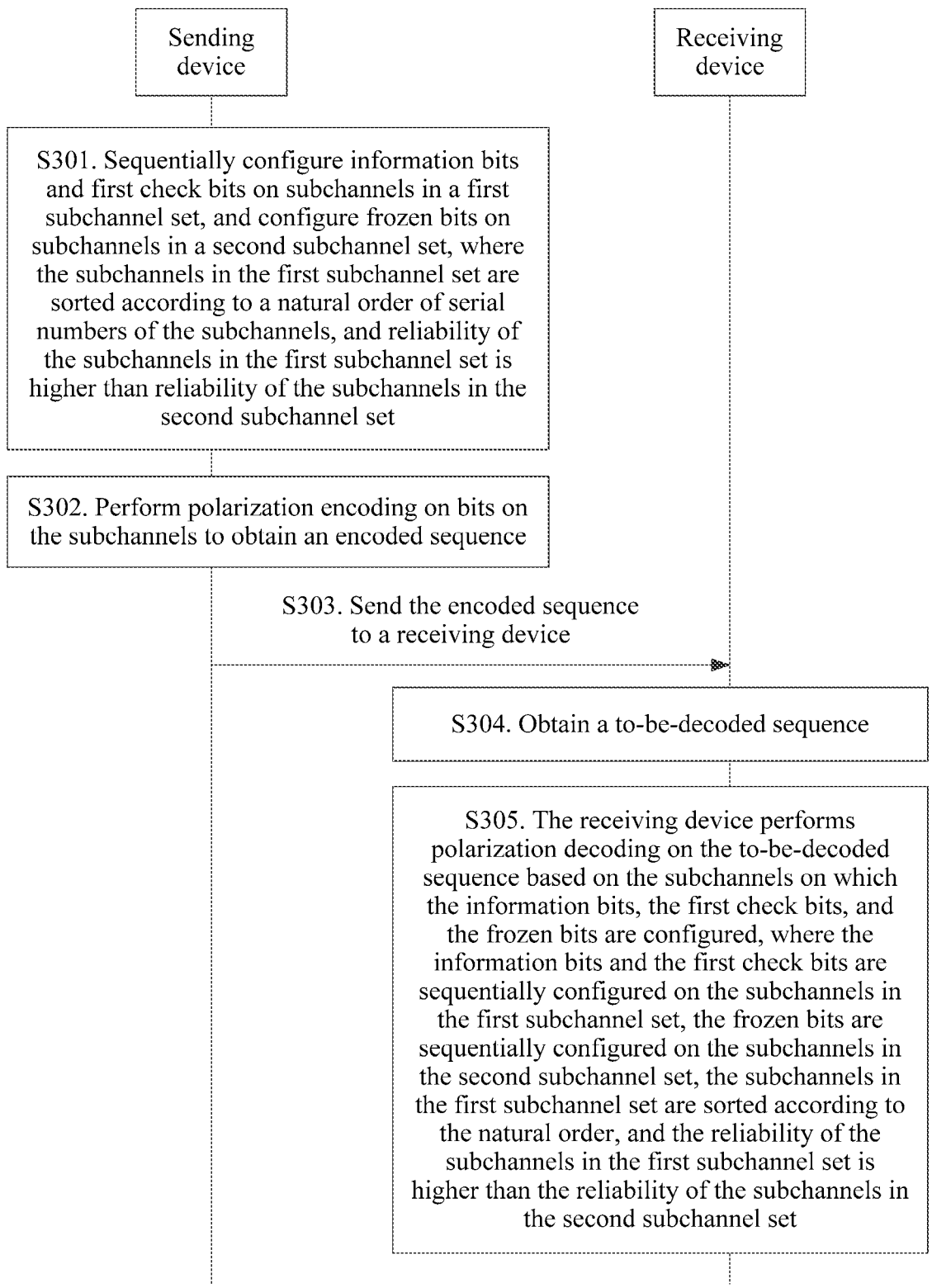
FIG. 3 is an interaction flowchart of an encoding method and a decoding method according to this application.

FIG. 3 is an interaction flowchart of an encoding method and a decoding method according to this application. As shown in FIG. 3, specific implementation steps of the encoding method and the decoding method are as follows:

S301. A sending device sequentially configures information bits and first check bits on subchannels in a first subchannel set, and configures frozen bits on subchannels in a second subchannel set, where the subchannels in the first subchannel set are sorted according to a natural order of serial numbers of the subchannels, and reliability of the subchannels in the first subchannel set is higher than reliability of the subchannels in the second subchannel set.

In actual application of polar codes, an important operation is to calculate reliability of all N subchannels for different channels to obtain a reliability sequence. Subchannels with relatively high reliability are allocated to the information bits and the first check bits based on the reliability sequence, and subchannels with relatively low reliability are allocated to the frozen bits. In this embodiment, the first check bits may be cyclic redundancy check (CRC) bits. The first check bits may include various CRC bits.

Common methods for calculating reliability of a polarization channel include density evolution (DE), Gaussian approximation (GA), linear fitting, polarization weight (PW), and another method.

For example, the polarization weight method is used. A polarization weight value of each subchannel may be calculated. As shown in FIG. 2, C(Wi) shows polarization weight values of all subchannels. A reliability sequence $Q_1^8 = [1, 2, 3, 5, 4, 6, 7, 8]$ of the subchannels may be obtained by sorting the polarization weight values in ascending order. Serial numbers in the reliability sequence are all serial numbers of the subchannels in a natural order. It should be noted that the serial numbers in this application are all sorted from 1. If the sorting needs to start from 0, correspondingly, the serial numbers need to decrease by 1 sequentially. Details are not described again in the following.

After the reliability sequence is obtained, because a total quantity of the information bits and the first check bits is K+J, the first subchannel set is determined based on the last K+J subchannels, and remaining subchannels are corresponding to the second subchannel set. Persons skilled in the art may understand that the reliability of the subchannels corresponding to the first subchannel set is higher than the reliability of the subchannels corresponding to the second subchannel set.

In this embodiment, both the first subchannel set and the second subchannel set include serial numbers of subchannels. As shown in FIG. 2, a position of each to-be-encoded bit u is corresponding to one subchannel. Therefore, in this embodiment, configuring a bit on a corresponding subchannel may be understood as configuring the bit in a corresponding position. As such, in this application, the subchannel may be further described in another way: The "subchannel" is replaced with "position", and a manner of configuring the bits is described by using a position. In this case, S301 may be described as follows: A sending device sequentially configures information bits and first check bits on positions in a first position set, and configures frozen bits on positions in a second position set, where the positions in the first position set are sorted according to a natural order of serial numbers of the positions, and reliability of the positions in the first position set is higher than reliability of the positions in the second position set. Correspondingly, both the first position set and the second position set include serial numbers of positions. In similar descriptions in the following, all the subchannels may be replaced with positions.

Further, in this embodiment, the subchannels corresponding to the first subchannel set are sorted according to the natural order of the serial numbers of the subchannels. The sorting according to the natural order is: sorting the subchannels in ascending order of the serial numbers of the subchannels. As shown in FIG. 2, sorting digits of W1, W2, . . . , and W8 from top to bottom is sorting the serial numbers of the subchannels according to a natural order. The first subchannel set may be a set of positions of the information bits (I) and the first check bits (A), and the second subchannel set may be a set of positions of the frozen bits (F).

For example, it is assumed that a sequence set with a relatively high reliability corresponding to K+J is [5, 4, 6, 7, 8]. In this case, the first subchannel set (I+A) is [4, 5, 6, 7, 8]. As such, the information bits and the first check bits may be sequentially allocated to subchannels W4, W5, W6, W7, and W8 shown in FIG. 2. For example, for a to-be-encoded vector, if there are four information bits and one first check bit, a position of a first information bit is u4, a position of a second information bit is u5, a position of a third information bit is u6, a position of a fourth information bit is u7, and a position of the first check bit is u8. There is no need to place the first information bit in u5 strictly according to a reliability order.

For a frozen bit, because the frozen bit is a predetermined fixed bit value and all frozen bit values are equal, the frozen bits may be simply allocated to the subchannels corresponding to the second subchannel set, without extra limitation on an allocation order and a sorting order of the subchannels corresponding to the second subchannel set.

Optionally, the subchannels corresponding to the second subchannel set may be sorted according to a natural order of serial numbers of the subchannels. In this case, the frozen bits may be allocated to the subchannels according to the natural order, without a need to skip one or more subchannels during allocation. In this way, encoding efficiency is improved.

It can be learned from the above that after the bits are allocated to the corresponding subchannels, input $u^8=(u_1, u_2, \ldots, u_8)$ on an encoder is obtained.

S302. The sending device performs polarization encoding on bits on the subchannels to obtain an encoded sequence.

S303. The sending device sends the encoded sequence to a receiving device.

After the sending device obtains an input vector of the encoder, the sending device performs polarization encoding on the bits on the subchannels. Optionally, the sending device may perform polarization encoding and rate matching on the bits on the subchannels to obtain the encoded sequence. This embodiment does not specially limit a specific implementation of polarization encoding herein.

After encoding is complete, the sending device sends the encoded sequence to the receiving device.

S304. The receiving device obtains a to-be-decoded sequence.

S305. The receiving device performs polarization decoding on the to-be-decoded sequence based on the subchannels on which the information bits, the first check bits, and the frozen bits are configured, where the information bits and the first check bits are sequentially configured on the subchannels in the first subchannel set, the frozen bits are sequentially configured on the subchannels in the second subchannel set, the subchannels in the first subchannel set are sorted according to a natural order, and the reliability of the subchannels in the first subchannel set is higher than the reliability of the subchannels in the second subchannel set.

The sending device sends the encoded sequence to the receiving device. For the receiving device, the encoded sequence is the to-be-decoded sequence. In a decoding process, the receiving device needs to determine the subchannels allocated to the information bits, the frozen bits, and the first check bits, namely, the positions of the information bits, the frozen bits, and the first check bits. The receiving device performs polarization decoding based on the positions and the to-be-decoded sequence. The polarization decoding method may be SC decoding, SCL decoding, or the like.

According to the encoding method and the decoding method provided in this embodiment, the sending device sequentially configures the information bits and the first check bits on the subchannels in the first subchannel set, configures the frozen bits on the subchannels in the second subchannel set, and performs polarization encoding on the bits on the subchannels to obtain the encoded sequence. The subchannels in the first subchannel set are sorted according to the natural order of the serial numbers of the subchannels, and the reliability of the subchannels in the first subchannel set is higher than the reliability of the subchannels in the second subchannel set. When encoding reliability is met, the information bits and the first check bits can be directly and sequentially placed on subchannels that are sorted according to a natural order, without a need to perform a skipping operation. In this way, encoding efficiency and decoding efficiency are improved to adapt to requirements for communication rates in various communication scenarios.

In the following, the encoding method provided in this application is described in detail by using several specific examples. For an implementation of determining the positions of the bits in the decoding process, refer to the implementation of determining the positions of the bits in an encoding process. Details are not described herein in this embodiment again.

Figure 4:
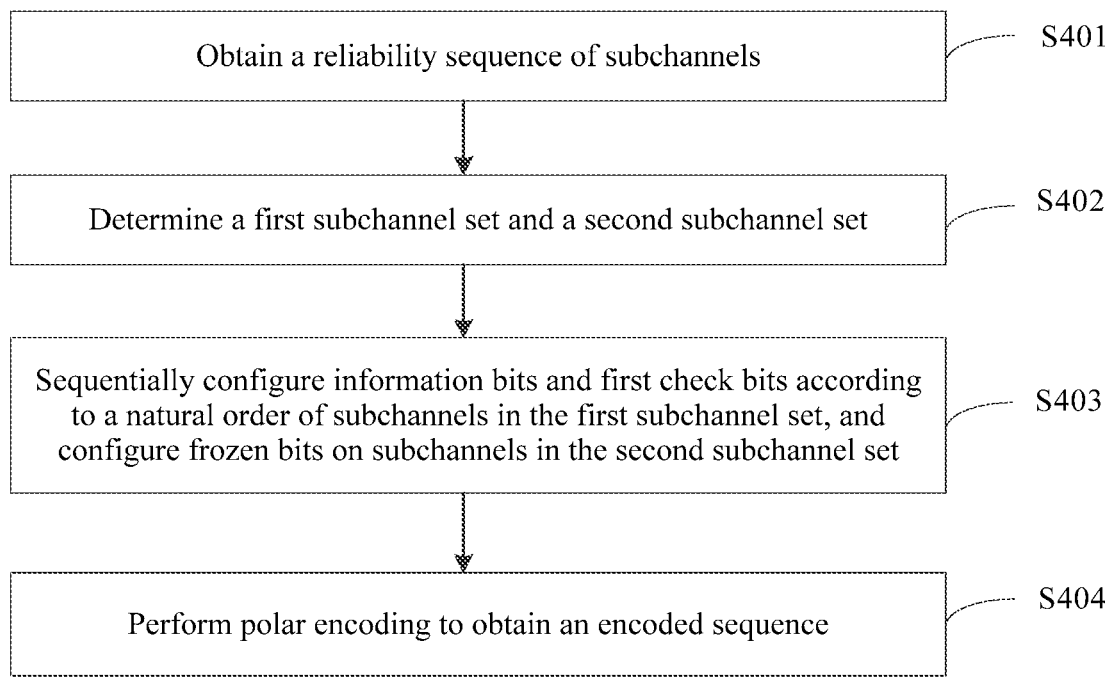
FIG. 4 is a first example of an encoding method according to an embodiment of this application.

FIG. 4 is a first example of an encoding method according to an embodiment of this application. As shown in FIG. 4, the method includes the following steps.

S401. Obtain a reliability sequence of subchannels.

The reliability sequence of the subchannels is determined. The reliability sequence of the subchannels may be a sequence constructed by using the method described above. A sending device may not construct the reliability sequence, but obtain the reliability sequence through table lookup, online calculation, or half table lookup and half calculation.

For example, a reliability sequence with a mother code length 64 is =[1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64]. The reliability sequence is sorted in ascending order of reliability.

S402. Determine a first subchannel set and a second subchannel set.

A set of the last K+J+J' subchannels in the reliability sequence is recorded as a set of information bits (I)+check bits (A), where K is a quantity of information bits, J is a quantity of first CRC bits, the first CRC bit is determined based on the information bits, J' is a quantity of second CRC bits, J' is determined based on a quantity of decoding paths, and J'≥0. Specifically, $J'=\log_2^N$, where N is the quantity of decoding paths.

When CRC is used to assist a decoder, at a final stage of decoding, CRC needs to be performed to check the paths to assist in decoding, and a false alarm probability is increased. Arrangement of the second CRC bit can decrease the false alarm probability. In other words, the increased false alarm probability and the decreased false alarm probability may reach a balanced state, and an increase in the false alarm probability is prevented.

A set corresponding to remaining subchannels is recorded as a fixed bit set. The fixed bit set is the second subchannel set, namely, a second position set.

For example, when K=32, the quantity of decoding paths is 8, J+J'=16+3=19, and a code rate is ½, the set of information bits+check bits is $(I+A)_1^{51}$
=[13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64].

The fixed bit set is $F_1^{13}$=[1, 2, 3, 5, 9, 17, 4, 33, 6, 7, 10, 11, 18].

The subchannels in the set $(I+A)_1^{32}$ of information bits+check bits are sorted according to a natural order to obtain the first subchannel set, that is, a first position set.

The first subchannel set is [8, 12, 13, 14, 15, 16, 19, 20, 21, 22, 23, 24, 25, 26, 27, 28, 29, 30, 31, 32, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64].

S403. Sequentially configure information bits and first check bits according to a natural order of subchannels in the first subchannel set, and configure frozen bits on subchannels in the second subchannel set.

The information bits are sequentially placed on the first 32 subchannels in the first subchannel set. After the placement of the information bits is complete, 19 first check bits are sequentially placed. For example, the first information bit is placed on the eighth channel, the second information bit is placed on the twelfth channel, the third information bit is placed on the thirteenth channel, and so on.

S404. Perform polar encoding to obtain an encoded sequence.

According to this embodiment, in an encoding process, placement positions of the check bits, the first CRC bit, and the second CRC bit are fully discussed, the first check bits include the first CRC bit and the second CRC bit, the first CRC bit is determined based on the information bits, and the second CRC bit is determined based on the quantity of decoding paths. The second CRC bit can prevent an increase in the false alarm probability.

Figure 5:
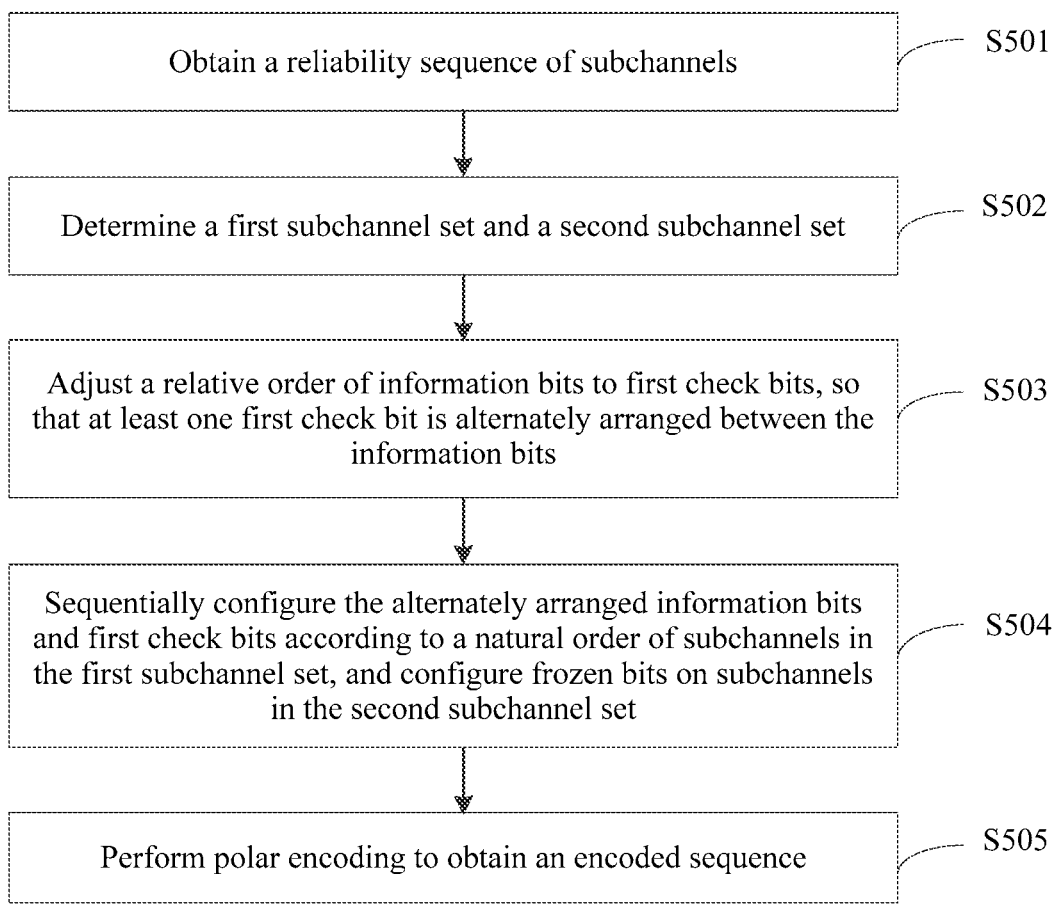
FIG. 5 is a second example of an encoding method according to an embodiment of this application.

FIG. 5 is a second example of an encoding method according to an embodiment of this application. As shown in FIG. 5, the method includes the following steps.

S501. Obtain a reliability sequence of subchannels.

S502. Determine a first subchannel set and a second subchannel set.

S501 and S502 are implemented in a similar way to S401 and S402. Details are not described herein in this embodiment again.

S503. Adjust a relative order of information bits to first check bits, so that at least one first check bit is alternately arranged between the information bits.

In this embodiment, based on the embodiment in FIG. 4, a sorting order of the information bits and the first check bits is adjusted, so that at least one first check bit is alternately arranged between the information bits.

The first check bits may be CRC bits. Optionally, the CRC bits may be the CRC bits shown in FIG. 4. That is, the CRC bits include a first CRC bit and a second CRC bit.

For example, a mode of alternately arranging the information bits and the first check bits is [IIIIAAIIIAIIII-IAIIA . . . ], where I represents the information bit and A represents the first check bit.

In a decoding process, the first check bits are distributed between the information bits. At an intermediate stage of decoding, early termination may be provided by using the first check bits. To be specific, in any path, when a decoding process is being executed, if a decoding error occurs, the decoding process in the path is interrupted and the path is deleted. In this way, a path in which PC decoding is successful is determined from a plurality of paths of a decoder.

For example, after the first four information bits are obtained, CRC check may be performed by using two first check bits following the four information bits. If the check fails, decoding is terminated. If the check succeeds, decoding is continued. In this way, early termination of the decoding process can be implemented.

In a specific implementation process, the adjustment of the relative order of the information bits to the first check bits may be implemented by using an interleaver according to a specific interleaving rule, so that at least one first check bit is alternately arranged between the information bits.

S504. Sequentially configure the alternately arranged information bits and first check bits according to a natural order of subchannels in the first subchannel set, and configure frozen bits on subchannels in the second subchannel set.

It can be learned that selection of the first subchannel set is unrelated to whether positions of the first check bits are adjusted in the step.

Specifically, [IIIIAAIIIAIIIIIAIIA . . . ] may be sequentially configured on the subchannels sorted according to the natural order in the first subchannel set.

S505. Perform polar encoding to obtain an encoded sequence.

According to this embodiment, at least one first check bit is alternately arranged between the information bits. In this way, early termination of a decoding process can be implemented, thereby reducing a decoding time and improving decoding efficiency.

Figure 6:
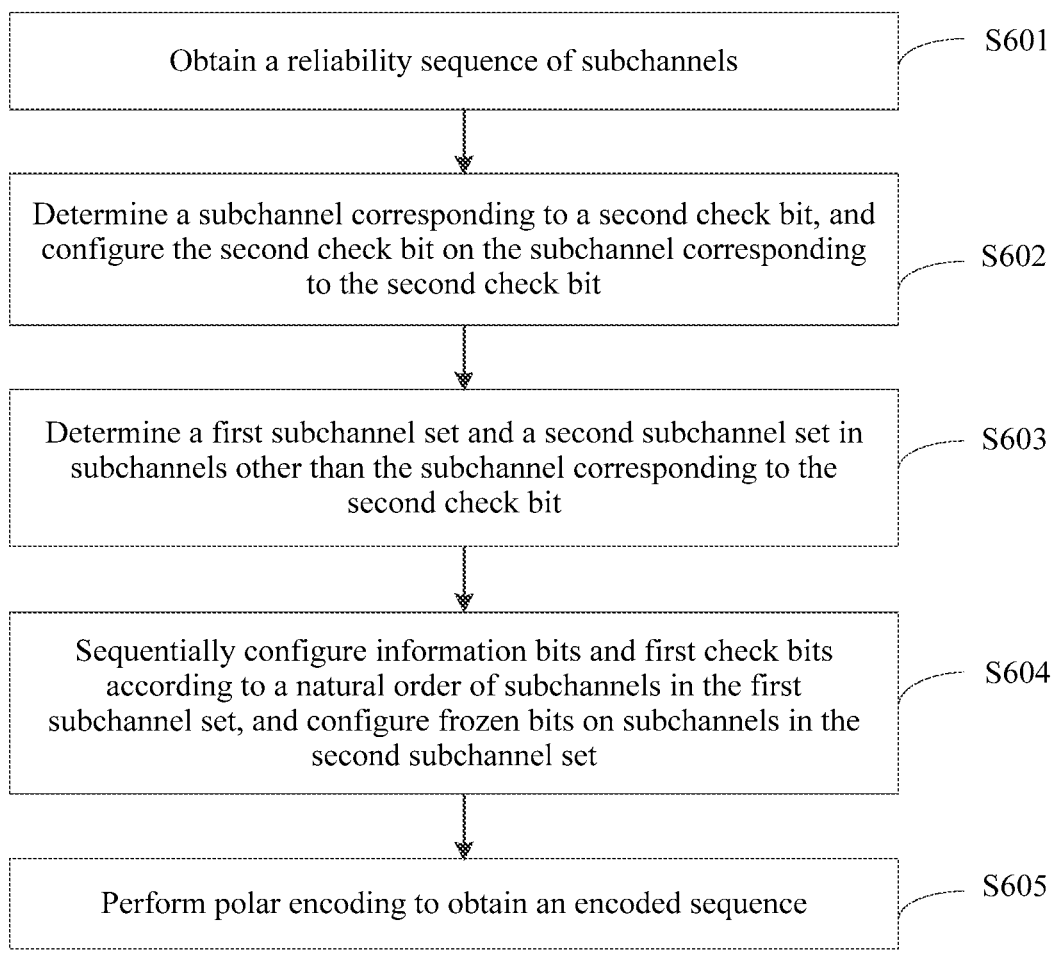
FIG. 6 is a third example of an encoding method according to an embodiment of this application.

FIG. 6 is a third example of an encoding method according to an embodiment of this application. As shown in FIG. 6, the method includes the following steps.

S601. Obtain a reliability sequence of subchannels.

S602. Determine a subchannel corresponding to a second check bit, and configure the second check bit on the subchannel corresponding to the second check bit.

S603. Determine a first subchannel set and a second subchannel set from subchannels other than the subchannel corresponding to the second check bit.

S601 is implemented in a similar way to S501. Details are not described herein in this embodiment again. In addition, S601 and S602 are not performed in a strict chronological order.

In this embodiment, not only first check bits are included, but also the second check bit is included. Optionally, the second check bit is a parity check (PC) bit. The PC bit may perform error correction in a decoding process. A position of the PC bit does not depend on reliability of a subchannel. Therefore, the subchannel corresponding to the PC bit, namely, the position of the PC bit, may be determined first. For an implementation of determining the position of the PC bit, refer to the prior art. Details are not described herein in this embodiment.

After the subchannel corresponding to the PC bit is obtained, the PC bit is configured on the corresponding subchannel.

If S602 is performed before S601, a reliability sequence of remaining subchannels is obtained.

If S601 is performed before S602, the subchannel occupied by the PC bit is removed from the reliability sequence.

S604. Sequentially configure information bits and first check bits according to a natural order of subchannels in the first subchannel set, and configure frozen bits on subchannels in the second subchannel set.

S605. Perform polar encoding to obtain an encoded sequence.

S604 and S605 are implemented in a similar way to S403 and S404 in the embodiment in FIG. 4. Details are not described herein in this embodiment again.

In this embodiment, not only an implementation with the first check bits is fully considered, but also an implementation with the second check bit is considered. In this way, different encoding and decoding options are provided for various scenarios.

Figure 7:
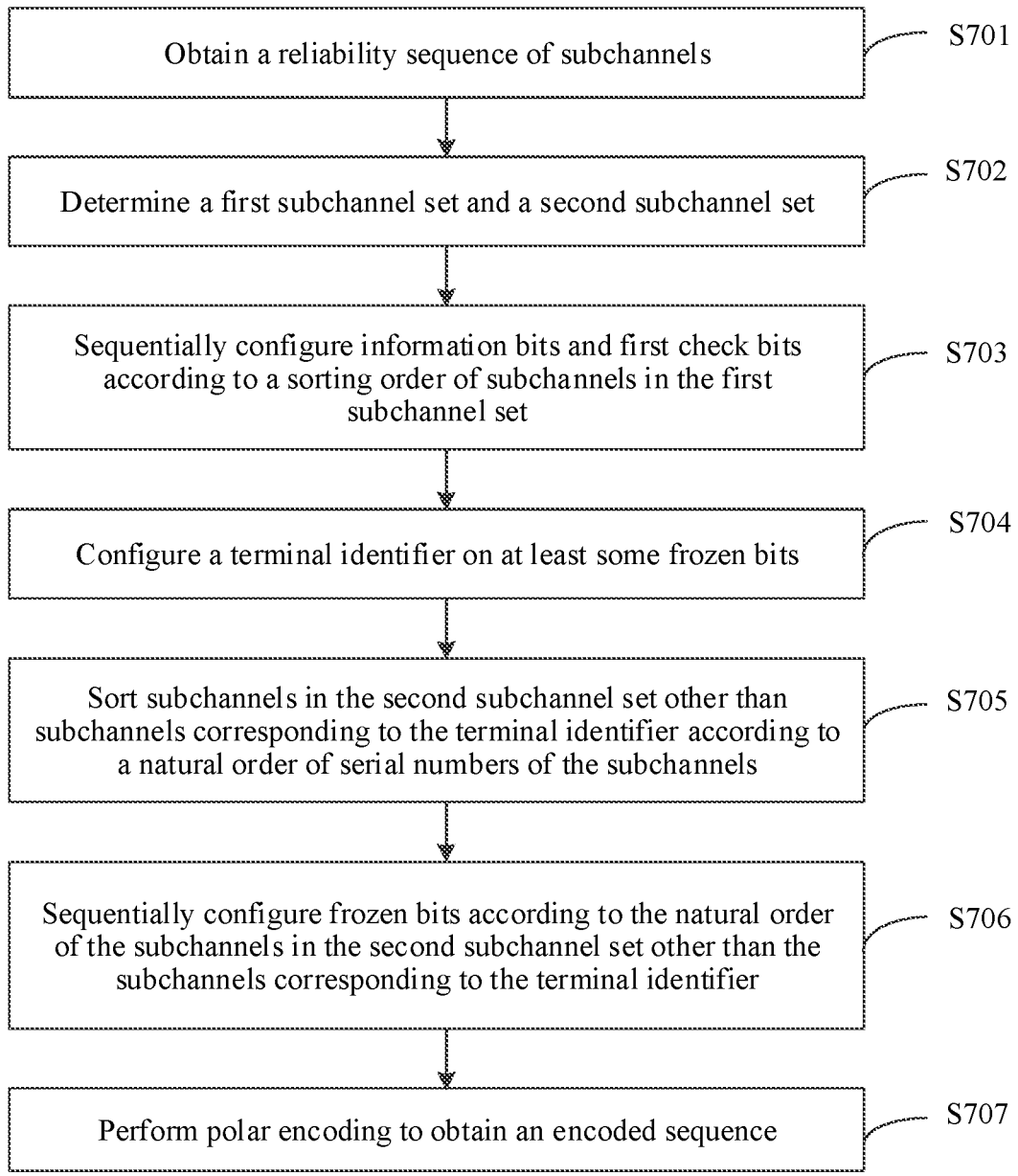
FIG. 7 is a fourth example of an encoding method according to an embodiment of this application.

FIG. 7 is a fourth example of an encoding method according to an embodiment of this application. As shown in FIG. 7, the method includes the following steps.

S701. Obtain a reliability sequence of subchannels.

S702. Determine a first subchannel set and a second subchannel set.

S703. Sequentially configure information bits and first check bits according to a sorting order of subchannels in the first subchannel set.

For specific implementations of S701 to S703, refer to the foregoing embodiments. Details are not described herein in this embodiment again.

S704. Configure a terminal identifier on at least some frozen bits.

In this embodiment, a sending device first obtains a cell serving the sending device, and then determines an identifier indication sequence that indicates the cell serving the sending device.

In this embodiment, some frozen bits further carry the terminal identifier. The addition of the terminal identifier is equivalent to scrambling some subchannels corresponding to the frozen bits. The terminal identifier may be a terminal identification number or another type of terminal identification. Without loss of generality, in this application, a radio network temporary identifier (RNTI) is used as an example.

The sending device adds an RNTI to information sent to a receiving device. When the receiving device performs decoding, the decoding succeeds only when a correct RNTI is placed in the frozen bits. Otherwise, the decoding performed by the receiving device fails. Placement positions of the RNTI may be predetermined by the sending device and the receiving device.

For example, if the sending device is a terminal device, and the receiving device is a network device, when the terminal device sends, to the network device, a to-be-decoded sequence carrying an RNTI, the network device places, in frozen bits, the RNTI of the terminal device obtained in another manner and performs decoding. If the decoding succeeds, the to-be-decoded sequence is exactly sent by the terminal device. If the decoding fails, the to-be-decoded sequence is actually interference information sent by another terminal device.

If the sending device is a network device, and the receiving device is a terminal device, when the network device sends, to the terminal device, a to-be-decoded sequence carrying an RNTI, the terminal device places its RNTI in frozen bits and performs decoding. If the decoding succeeds, the to-be-decoded sequence is sent to the terminal device from the network device. If the decoding fails, the network device sends incorrect information. The arrangement of the RNTI in frozen bits ensures information transmission accuracy.

S705. Sort subchannels in the second subchannel set other than subchannels corresponding to the terminal identifier according to a natural order of serial numbers of the subchannels.

S706. Sequentially configure frozen bits according to a natural order of the subchannels in the second subchannel set other than the subchannels corresponding to the terminal identifier.

S707. Perform polar encoding to obtain an encoded sequence.

When the RNTI occupies a subchannel in the second subchannel set, remaining subchannels are sorted according to the natural order, and the frozen bits are sequentially configured according to the natural order of the subchannels.

This embodiment provides a manner of configuring subchannels of the information bits, the first check bits, the frozen bits, and the like when the frozen bits carry the RNTI. Scrambling performed on the frozen bits by using the RNTI can prevent interference information between the sending device and the receiving device, so that interference is cancelled.

Certainly, even if the frozen bits carry the RNTI information, all the subchannels in the second subchannel set may be sorted according to the natural order, and the frozen bits may be sequentially configured according to the natural order of the subchannels. In other words, whether the RNTI information is carried is not considered when sorting is performed according to the natural order.

Persons skilled in the art may understand that the embodiments in FIG. 4 to FIG. 7 merely provide several implementations by using examples. In a specific implementation process, another embodiment may be obtained by performing deduction and transformation based on the embodiments in FIG. 4 to FIG. 7, and the another embodiment is within the protection scope of this application.

In the foregoing embodiment, the natural order is a manner of performing sorting in ascending order of serial numbers starting from 1. In some possible implementations, alternatively, the natural order may be a manner of performing sorting in descending order of serial numbers, and this is also applicable to the method in this application. Details are not further described.

Figure 8:
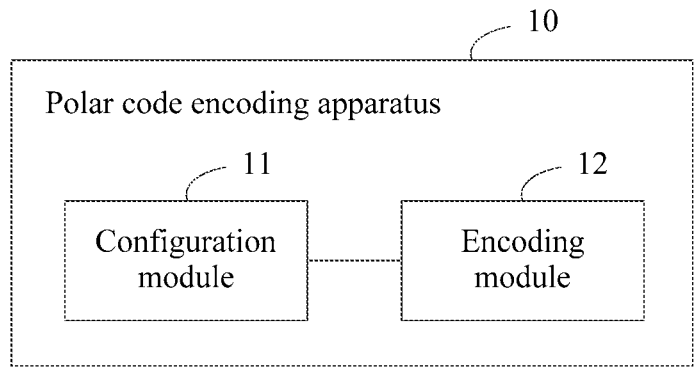
FIG. 8 is a schematic structural diagram of a polar code encoding apparatus according to this application.

FIG. 8 is a schematic structural diagram of a polar code encoding apparatus according to this application. As shown in FIG. 8, the encoding apparatus 10 includes:

a configuration module 11, configured to sequentially configure information bits and first check bits on subchannels in a first subchannel set, and configure frozen bits on subchannels in a second subchannel set, where the subchannels in the first subchannel set are sorted according to a natural order of serial numbers of the subchannels, and reliability of the subchannels in the first subchannel set is higher than reliability of the subchannels in the second subchannel set; and an encoding module 12, configured to perform polarization encoding on bits on the subchannels to obtain an encoded sequence.

Optionally, the sorting according to a natural order is: sorting the subchannels in ascending order of the serial numbers of the subchannels.

Optionally, at least one first check bit is alternately arranged between the information bits.

Optionally, the first check bits are cyclic redundancy check CRC bits.

Optionally, the first check bits include a first CRC bit and a second CRC bit, the first CRC bit is determined based on the information bits, and the second CRC bit is determined based on a quantity of decoding paths.

Optionally, the configuration module 11 is further configured to:

determine a subchannel corresponding to a second check bit, and configure the second check bit on the subchannel corresponding to the second check bit; and determine the first subchannel set and the second subchannel set from subchannels other than the subchannel corresponding to the second check bit.

Optionally, the second check bit is a parity check PC bit.

Optionally, the subchannels in the second subchannel set are sorted according to a natural order of serial numbers of the subchannels.

Optionally, at least some of the frozen bits carry a terminal identifier.

Subchannels in the second subchannel set other than subchannels corresponding to the terminal identifier are sorted according to a natural order of serial numbers of the subchannels.

The polar code encoding apparatus provided in this embodiment can execute the polar code encoding method related to the foregoing method embodiments. Implementation principles and technical effects of the polar code encoding apparatus are similar to those of the polar code encoding method. Details are not described herein in this embodiment again. The encoding apparatus may be integrated into a terminal device or a network device.

Figure 9:
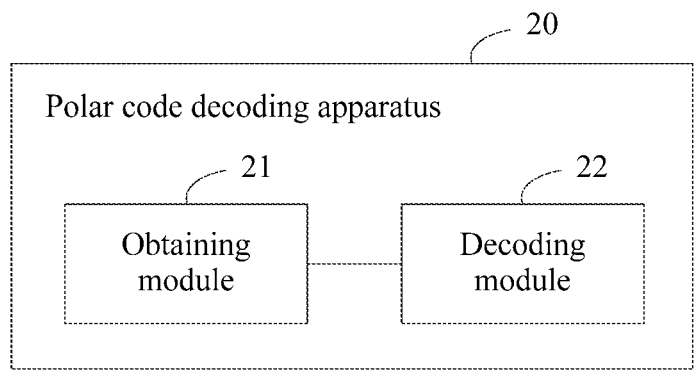
FIG. 9 is a schematic structural diagram of a polar code decoding apparatus according to this application.

FIG. 9 is a schematic structural diagram of a polar code decoding apparatus according to this application. The decoding apparatus 20 includes an obtaining module 21 and a decoding module 22.

The obtaining module 21 is configured to obtain a to-be-decoded sequence.

The decoding module 22 is configured to perform polarization decoding on the to-be-decoded sequence based on subchannels on which information bits, first check bits, and frozen bits are configured, where the information bits and the first check bits are sequentially configured on subchannels in a first subchannel set, the frozen bits are sequentially configured on subchannels in a second subchannel set, the subchannels in the first subchannel set are sorted according to a natural order, and reliability of the subchannels in the first subchannel set is higher than reliability of the subchannels in the second subchannel set.

Optionally, the sorting according to a natural order is: sorting the subchannels in ascending order of serial numbers of the subchannels.

Optionally, at least one first check bit is alternately arranged between the information bits.

Optionally, the first check bits are cyclic redundancy check CRC bits.

Optionally, the first check bits include a first CRC bit and a second CRC bit, the first CRC bit is determined based on the information bits, and the second CRC bit is determined based on a quantity of decoding paths.

Optionally, a pre-encoding sequence corresponding to the to-be-decoded sequence further includes a second check bit. The first subchannel set and the second subchannel set are sets determined in subchannels other than a subchannel corresponding to the second check bit.

Optionally, the second check bit is a parity check PC bit.

Optionally, the subchannels in the second subchannel set are sorted according to a natural order of serial numbers of the subchannels.

Optionally, at least some of the frozen bits carry a terminal identifier.

Subchannels in the second subchannel set other than subchannels corresponding to the terminal identifier are sorted according to a natural order of serial numbers of the subchannels.

The polar code decoding apparatus provided in this embodiment can execute the polar code decoding method related to the foregoing method embodiments. Implementation principles and technical effects of the polar code decoding apparatus are similar to those of the polar code decoding method. Details are not described herein in this embodiment again. The decoding apparatus may be integrated into a terminal device or a network device.

It should be understood that in the implementation of the foregoing encoding apparatus or decoding apparatus, the configuration module, the encoding module, the obtaining module, the decoding module, and the like may be implemented as a processor.

Figure 10:
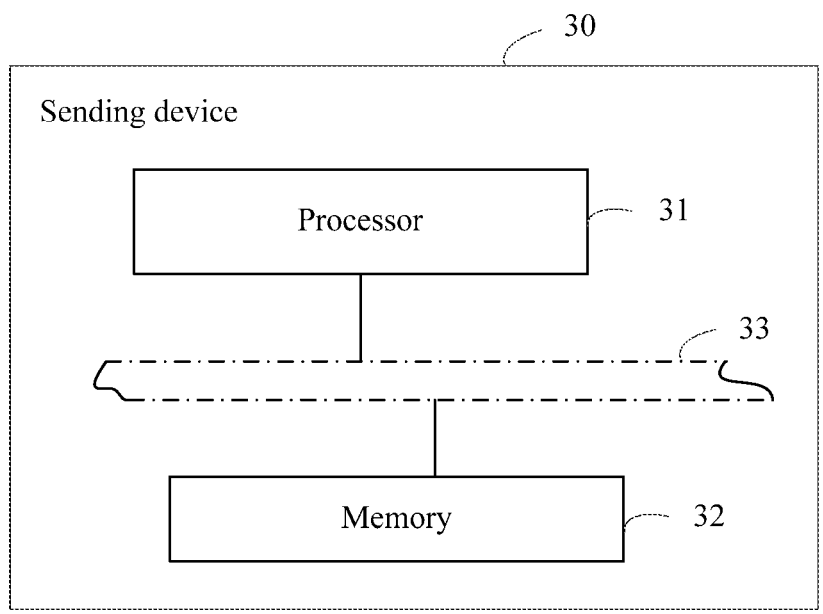
FIG. 10 is a schematic diagram of a hardware structure of a sending device according to this application.

FIG. 10 is a schematic diagram of a hardware structure of a sending device according to this application. As shown in FIG. 10, the sending device 30 includes a processor 31 and a memory 32.

The memory 32 is configured to store a computer program. In addition, the memory may be a flash.

The processor 31 is configured to execute an execution instruction stored in the memory, to implement the steps in the foregoing encoding methods. For details, refer to related descriptions in the foregoing method embodiments.

Optionally, the memory 32 may be independent or may be integrated with the processor 31.

When the memory 32 is a device independent of the processor 31, the sending device 30 may further include a bus 33.

The bus 33 is configured to connect the memory 32 and the processor 31. The sending device in FIG. 10 may further include a transmitter (not shown in the figure), configured to send an encoded sequence that is obtained after the processor 31 performs polar encoding.

Figure 11:
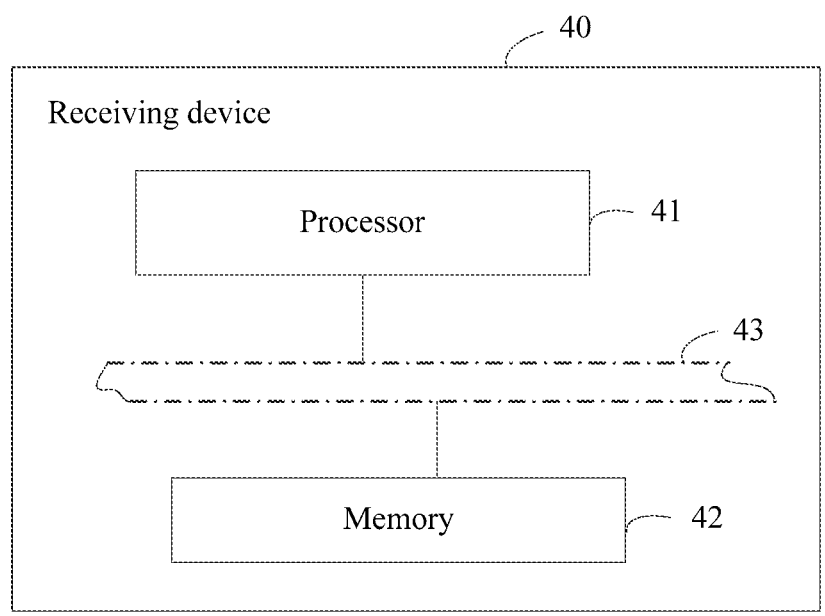
FIG. 11 is a schematic diagram of a hardware structure of a receiving device according to this application.

FIG. 11 is a schematic diagram of a hardware structure of a receiving device according to this application. As shown in FIG. 11, the receiving device 40 includes a processor 41 and a memory 42.

The memory 42 is configured to store a computer program. In addition, the memory may be a flash.

The processor 41 is configured to execute an execution instruction stored in the memory, to implement the steps in the foregoing decoding methods. For details, refer to related descriptions in the foregoing method embodiments.

Optionally, the memory 42 may be independent or may be integrated with the processor 41.

When the memory 42 is a device independent of the processor 41, the receiving device 40 may further include a bus 43.

The bus 43 is configured to connect the memory 42 and the processor 41. The receiving device in FIG. 11 may further include a receiver (not shown in the figure), configured to receive a to-be-decoded sequence.

This application further provides a readable storage medium. The readable storage medium stores an execution instruction. When at least one processor of a sending device executes the execution instruction, the sending device executes the encoding methods provided in the foregoing implementations.

This application further provides a readable storage medium. The readable storage medium stores an execution instruction. When at least one processor of a receiving device executes the execution instruction, the receiving device executes the decoding methods provided in the foregoing implementations.

This application further provides a program product. The program product includes an execution instruction, and the execution instruction is stored in a readable storage medium. At least one processor of a sending device can read the execution instruction from the readable storage medium, and the at least one processor executes the execution instruction, so that the sending device implements the encoding methods provided in the foregoing implementations.

This application further provides a program product. The program product includes an execution instruction, and the execution instruction is stored in a readable storage medium. At least one processor of a receiving device can read the execution instruction from the readable storage medium, and the at least one processor executes the execution instruction, so that the receiving device implements the decoding methods provided in the foregoing implementations.

It should be understood that in the foregoing sending device or receiving device embodiment, the processor may be a central processing unit (CPU), or may be another general-purpose processor, a digital signal processor (DSP), an application specific integrated circuit (ASIC), or the like. The general-purpose processor may be a microprocessor, or the processor may be any conventional processor or the like. The steps of the methods disclosed with reference to this application may be directly implemented by a hardware processor, or may be implemented by a combination of hardware and a software module in a processor.

All or some steps of the foregoing method embodiments may be implemented by using hardware related to a program instruction. The foregoing program may be stored in a readable memory. When the program is executed, the steps of the methods in the embodiments are performed. The memory (storage medium) includes: a read-only memory (ROM), a RAM, a flash memory, a hard disk, a solid state disk, a magnetic tape, a floppy disk, an optical disc, and any combination thereof.

It should be finally noted that although the solutions are described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this application.

What is claimed is:

1. A polar code encoding method, comprising:
sequentially configuring, by a sending device, information bits and first check bits on subchannels in a first subchannel set, and configuring frozen bits on subchannels in a second subchannel set, wherein the subchannels in the first subchannel set are sorted according to a natural order of serial numbers of the subchannels, wherein reliability of the subchannels in the first subchannel set is higher than reliability of the subchannels in the second subchannel set, and wherein at least one of the frozen bits carries a terminal identifier, and subchannels in the second sub channel set other than subchannels corresponding to the terminal identifier are sorted according to a natural order of serial numbers of the subchannels;
performing, by the sending device, polarization encoding on bits on the subchannels to obtain an encoded sequence; and
transmitting, by the sending device over a wireless communication channel, the encoded sequence to a receiving device.

2. The method according to claim 1, wherein the subchannels in the first subchannel set are sorted according to an ascending order of the serial numbers of the subchannels.

3. The method according to claim 1, wherein at least one first check bit is alternately arranged between the information bits.

4. The method according to claim 1, wherein the first check bits are cyclic redundancy check (CRC) bits.

5. The method according to claim 4, wherein the first check bits comprise a first CRC bit and a second CRC bit, a quantity of the first CRC bit is determined based on the information bits, and a quantity of the second CRC bit is determined based on a quantity of decoding paths.

6. The method according to claim 1, wherein before the sequentially configuring the information bits and the first check bits and the configuring the frozen bits, the method further comprises:
determining, by the sending device, a subchannel corresponding to a second check bit;
configuring the second check bit on the subchannel corresponding to the second check bit; and
determining, by the sending device, the first subchannel set and the second subchannel set from subchannels other than the subchannel corresponding to the second check bit.

7. The method according to claim 6, wherein the second check bit is a parity check (PC) bit.

8. The method according to claim 1, wherein the subchannels in the second subchannel set are sorted according to a natural order of serial numbers of the subchannels.

9. A polar code encoding apparatus, comprising:
a non-transitory memory, configured to store instructions; and
at least one processor, wherein when the instructions are executed by the at least one processor, the at least one processor is configured to sequentially configure information bits and first check bits on subchannels in a first subchannel set, and configure frozen bits on subchannels in a second subchannel set, wherein the subchannels in the first subchannel set are sorted according to a natural order of serial numbers of the subchannels, wherein reliability of the subchannels in the first subchannel set is higher than reliability of the subchannels in the second subchannel set and wherein at least one of the frozen bits carries a terminal identifier, and subchannels in the second subchannel set other than subchannels corresponding to the terminal identifier are sorted according to a natural order of serial numbers of the sub channels;
perform polarization encoding on bits on the subchannels to obtain an encoded sequence; and
transmitting, over a wireless communication channel, the encoded sequence to a receiving device.

10. The apparatus according to claim 9, wherein the subchannels in the first subchannel set are sorted according to an ascending order of the serial numbers of the subchannels.

11. The apparatus according to claim 9, wherein at least one first check bit is alternately arranged between the information bits.

12. The apparatus according to claim 9, wherein the first check bits are cyclic redundancy check (CRC) bits.

13. The apparatus according to claim 12, wherein the first check bits comprise a first CRC bit and a second CRC bit, a quantity of the first CRC bit is determined based on the information bits, and a quantity of the second CRC bit is determined based on a quantity of decoding paths.

14. The apparatus according to claim 9, wherein the at least one processor is further configured to:
   determine a subchannel corresponding to a second check bit;
   configure the second check bit on the subchannel corresponding to the second check bit; and
   determine the first subchannel set and the second subchannel set from subchannels other than the subchannel corresponding to the second check bit.

15. The apparatus according to claim 14, wherein the second check bit is a parity check (PC) bit.

16. The apparatus according to claim 9, wherein the subchannels in the second subchannel set are sorted according to a natural order of serial numbers of the subchannels.

17. A non-transitory storage medium, comprising a computer program, wherein when the computer program is executed by a polar code encoding apparatus, the apparatus performs:
   sequentially configuring, by a sending device, information bits and first check bits on subchannels in a first subchannel set, and configuring frozen bits on subchannels in a second subchannel set, wherein the subchannels in the first subchannel set are sorted according to a natural order of serial numbers of the subchannels, wherein reliability of the subchannels in the first subchannel set is higher than reliability of the subchannels in the second subchannel set, and wherein at least one of the frozen bits carries a terminal identifier, and subchannels in the second subchannel set other than subchannels corresponding to the terminal identifier are sorted according to a natural order of serial numbers of the subchannels;
   performing, by the sending device, polarization encoding on bits on the subchannels to obtain an encoded sequence; and
   transmitting, by the sending device over a wireless communication channel, the encoded sequence to a receiving device.

* * * * *